United States Patent [19]

Lim

[11] Patent Number: 5,162,244
[45] Date of Patent: Nov. 10, 1992

[54] BIPOLAR TRANSISTOR AND MANUFACTURING METHOD THEREOF

[75] Inventor: Soon-kwon Lim, Pucheon, Rep. of Korea

[73] Assignee: SamSung Electronics Co., Ltd., Suweon City, Rep. of Korea

[21] Appl. No.: 358,023

[22] Filed: May 31, 1989

[30] Foreign Application Priority Data

Sep. 23, 1988 [KR] Rep. of Korea ............... 88-12323

[51] Int. Cl.⁵ ............................................ H01L 21/265
[52] U.S. Cl. ................................... 437/31; 437/32; 437/69; 437/909; 437/917; 437/162; 437/968; 437/984
[58] Field of Search ................. 437/31, 32, 33, 69, 437/909, 917, 968, 980, 70, 162, 984; 148/DIG. 102, DIG. 111, DIG. 131

[56] References Cited

U.S. PATENT DOCUMENTS

| | | | |
|---|---|---|---|
| 4,746,623 | 5/1988 | Lane | 437/33 |
| 4,778,774 | 10/1988 | Blossfeld | 437/32 |
| 4,786,610 | 11/1988 | Blossfeld | 437/203 |
| 4,829,015 | 5/1989 | Schaber et al. | 437/33 |
| 4,871,685 | 10/1989 | Taka et al. | 437/33 |
| 4,882,297 | 11/1989 | Blossfeld | 148/DIG. 19 |
| 4,883,772 | 11/1989 | Cleeves et al. | 437/33 |

OTHER PUBLICATIONS

Bondur et al., "Selective Reactive Ion Etching of Silicon Compounds", IBM Tech. Disc. Bul., vol. 21, No. 10, Mar. 1979, pp. 4015.

*Primary Examiner*—Brian E. Hearn
*Assistant Examiner*—Tuan Nguyen
*Attorney, Agent, or Firm*—Robert E. Bushnell

[57] ABSTRACT

Disclosed is a method for manufacturing a high speed bipolar transistor having vertically an emitter zone, a base zone and a collector zone comprising steps of: shielding an active region; forming a bird's beak as a spacer by a field oxidation and etching; forming a base terminal; forming an emitter zone; and metallizing. By the method, a minimum spacing is effectively achieved between the base terminal and the emitter zone of the transistor by utilizing a bird's beak as a spacer by which an exact self alignment between the base terminal and the emitter zone is naturally effected.

14 Claims, 3 Drawing Sheets

BIPOLAR TRANSISTOR AND MANUFACTURING METHOD THEREOF

FIELD OF THE INVENTION

The present invention relates to a high speed bipolar transistor operative in a microwave band and a manufacturing method thereof, and particularly a high speed bipolar transistor and a manufacturing method thereof, in which a minimum spacing between the base and the emitter in a bipolar transistor is determined by using a BIRD'S BEAK phenomenon due to a LOCOS (LOCal Oxidation of Silicon) process.

BACKGROUND OF THE INVENTION

Generally, to endow a semiconductor integrated circuit with a good electrical characteristics, it is necessary to enhance characteristics of operating speed and power dissipation in an individual circuitry element constituting the semiconductor integrated circuit. Especially, bipolar devices greatly used in such a high speed electric and electronic system as a computer, a communication apparatus and the like should be improved in respect to a device size as well as operating speed characteristics as the constructions of such systems are becoming more complicated day by day.

Further, for higher packing density, lower power dissipation and more fast speed of bipolar transistors, the capacitance and the resistance between the respective devices should be also reduced. Reduction of such resistance and capacitance for determining the operation characteristics of bipolar transistors has become attained by minimizing the minimum distance from the edge of the emitter region to the base electrode. For a related technology, a PSA (Polysilicon Self-Align) process is known in the art, using a device separation with an oxide layer and a self-aligning of the emitter and the base: the bipolar transistor manufactured by this process has been called a PSA bipolar transistor. The base resistance of the bipolar transistor influencing its operational characteristics is based upon the distance from the base contact window to the emitter and the intrinsic base, where the substantial operation of the bipolar transistor is carried. However, because of the restrictions that the distance of the emitter layout metal-the base layout metal be ensured to a proper level, there is a limitation in reducing a device area, resulting that more reduction of the resistance and the capacitance existing in the bipolar transistor itself is substantially impossible not to expect good fruits with respect to the improvement of the operating speed and power dissipation.

A recent polysilicon self-aligned bipolar transistor developed in efforts to overcome the afore-mentioned problems is provided with a spacer which includes a minimum-size separation means, which is formed by a reactive ion etching process and an emitter-base self-aligning process using the overlapping construction of the double polysilicon.

The next two methods are widely utilized to manufacture a spacer constituting the minimum-size separation means.

First, as shown in FIG. 1A, a spacer 28 is constructed in such a manner that it intrudes into the side wall portions of the emitter forming region. More specifically, initially a first polysilicon layer 27 for a base is deposited on the surface of a substrate, and an opening for securing a emitter forming region is perforated, and in turn an oxide layer 26 is provided to cover the first polysilicon layer 27, and then a spacer 28 is formed at the inner peripheral portions of the first polysilicon layer 27 through the oxide layer 26 by means of reactive ion etching process. Next, a second polysilicon layer 25 of an emitter is deposited toward the opening for an emitter forming region, and an oxide layer 24 covers the whole surface of the transistor region. After passing the process of forming the connection windows, the respective metal electrodes 22, 23 are deposited and are connected through the connection windows to the corresponding first polysilicon layer 27 of a base and second polysilicon layer 25 of an emitter to generate a resultant bipolar transistor in which the emitter and the base are self-aligned.

Second, a spacer 28' is formed to extrude from the side wall portions of the emitter forming region. In this way, an emitter forming region is shielded by a nitride layer and/or an oxide layer, and a polysilicon layer 27' of a base is deposited on the surface of a substrate, and in turn an oxide layer 26' is deposited on the polysilicon layer 27' of a base, and then an opening for securing an emitter forming region is perforated through the reactive ion etching process. Successively, a spacer 28' is formed to infringe directly from the central opening toward the inner peripheral portions of the polysilicon layer 27'. The other portions 22', 23', 24', 25' and 26' are manufactured through the same manner as the above first case.

Further, details of such an advanced PSA bipolar transistor are disclosed in the journals of *IEEE TRANSACTIONS ON ELECTRON DEVICES*, Vol. ED-27, No. 8, 1980, pp 1390–1394 and Vol. ED-33, No. 4, 1986, pp 526–531 etc.

Although those bipolar transistors manufactured in the above methods, however, have revealed improvements worthy of close attention compared to the anterior PSA bipolar transistor, as the length or the width of the spacer constituting the minimum-size separation means is to be adjusted by the reactive ion etching process of the dry etching type, the process control is difficult and complicated, and is thus to be liable to damage the silicon surface of the transistor active region and to deteriorate rather the electrical characteristics of the bipolar transistor device.

SUMMARY OF THE INVENTION

The present invention aims to provide a high speed bipolar transistor and a process for manufacturing the same which enable the problems accompanying conventional technology to be solved.

According to the present invention, there is provided a high speed bipolar transistor in which a portion of the field oxidation layer resulting from the BIRD'S BEAK phenomenon during the field oxidation of a LOCOS process, constitutes a spacer for holding a minimum spacing from the emitter to the base terminal.

Moreover, according to the present invention, there is provided a process for manufacturing the high speed bipolar transistor having vertically an emitter zone, a base zone and a collector zone, comprising the following steps in sequence:

(a) shielding an active region of said transistor with a silicon nitride layer and a first polysilicon layer stacked successively over a n-doped silicon substrate of which the surface is coated with a pad oxide film and in the top portion of which is formed a $p^-$-doped layer by penetrating of $p^-$-ion through said pad oxide film;

(b) locally growing said pad oxide film except said active region to form a field oxide layer, said filed oxide layer having a bird's beak extended into said active region, and to change said first polysilicon layer into a silicon oxide layer;

(c) vertically etching said field oxide layer and said silicon oxide layer to leave only said bird's beak as a spacer, wherein said silicon nitride layer located on the active region services as an etching mask;

(d) depositing a p+-doped second polysilicon layer and coating a photoresist thereon and then back etching to remove said P+-doped second plysilicon layer positioned on said silicon nitride layer and the photoresist positioned on said P+-doped polysilicon layer;

(e) growing a silicon oxide layer on said P+-doped second polysilicon layer as a base terminal wherein a P+-doped layer serving as a extrinsic base is formed in said silicon substrate positioned below said P+-doped second polysilicon layer and is extended below said spacer;

(f) removing said silicon nitride layer and pad oxide film positioned on said active region and forming an emitter terminal as a N+-doped third polysilicon layer; and (g) depositing an insulating layer and then performing constitution of contacts and metallization.

According to the present invention, a minimum spacing between the emitter region and the base terminal can be easily secured by utilizing the particular BIRD'S BEAK phenomenon in the LOCOS process, and therefore the manufacture of the high speed bipolar transistor is more simplified over the conventional ones. Additionally, the internal resistance of the device and the capacitance between the respective devices are much reduced to ensure the high performance, safe electrical characteristics of the bipolar transistor.

DETAILED DESCRIPTION OF THE PREFERRED EMBODIMENTS

Figure 1A:
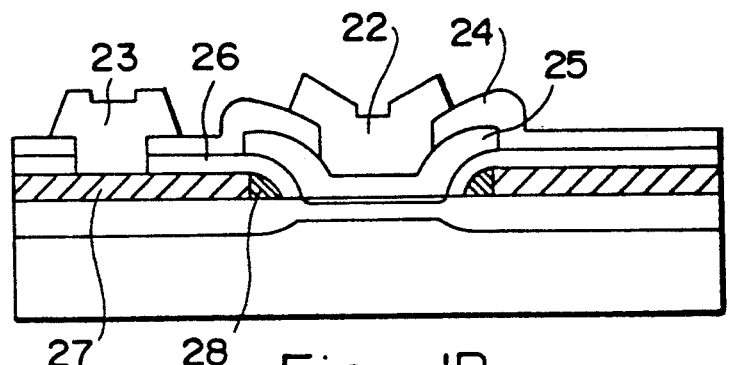
FIG. 1A and 1B are sectional views showing the emitter-base construction of the conventional polysilicon self-aligned bipolar transistors.
Figure 1B:
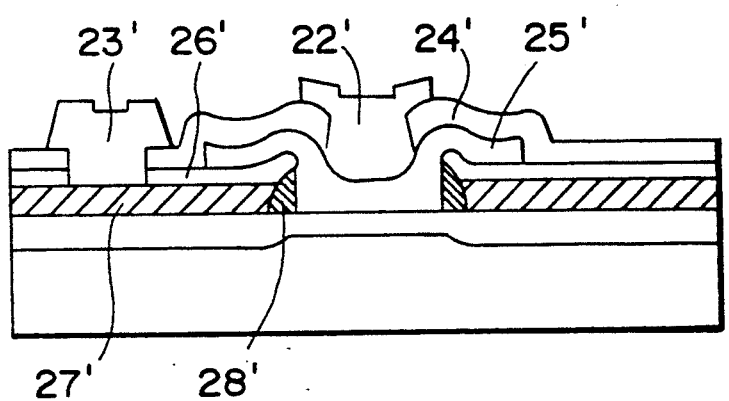
Figure 2:
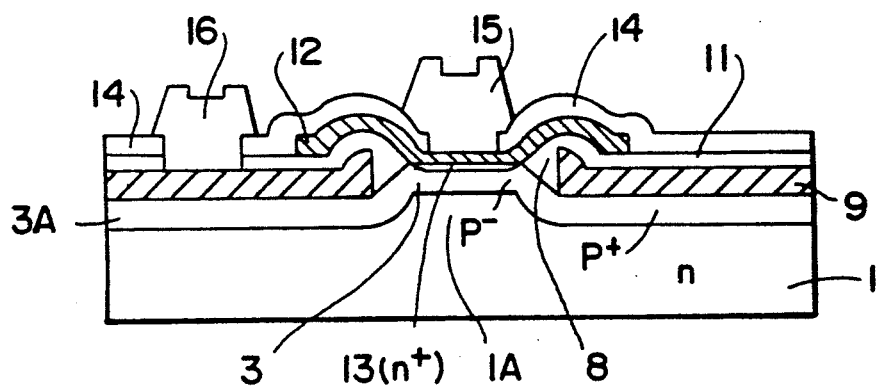
FIG. 2 is a sectional view of the bipolar transistor according to the present invention.

Referring to FIG. 2, there is shown a high speed, emitter-base self-aligned bipolar transistor in which a portion of the field oxidation layer resulting near the emitter region 13 from the BIRD'S BEAK phenomenon during the field oxidation of LOCOS process constitutes a spacer 8 for holding a minimum spacing from the emitter region to the base terminal.

The high speed bipolar transistor has vertically: a N+-doped emitter zone 13, a P−-doped intrinsic base zone 3 and a n-doped collector zone 1A in silicon substrate 1. The emitter zone 13 is defined by a spacer 8.

Spacer 8 in the form of bird's beak is generated by local oxidation process for keeping a minimum spacing between the emitter zone 13 and a base terminal 9. The base terminal 9 consisting of P+-doped polysilicon is formed around and spaced apart from the emitter zone 13. An extrinsic base zone 3A is formed in the upper portion of the substrate 1 by diffusion of the P+-ions which have been implanted into the base terminal 9.

An emitter terminal 12, consisting of N+-doped polysilicon is formed over the emitter zone 13, the spacer 8 and the edge of the base terminal 9. The emitter terminal 12 is insulated from the base terminal 9 by a silicon oxidation layer 11. Emitter zone 13 is formed in the upper portion of the intrinsic base zone 3 by diffusion of the N+-ions which have been implanted into emitter terminal 12.

Spacer 8 determines the separation between the N+emitter zone 13 and P+extrinsic base zone 3A as well as the link-up between the intrinsic and extrinsic base 3 and 3A. The respective emitter and base terminals 12 and 9 contact an emitter electrode 15 and a base electrode 16 respectively.

Now, a process for manufacturing the bipolar transistor according to the present invention will be described with reference to FIG. 3A to 3G.

Figure 3A:
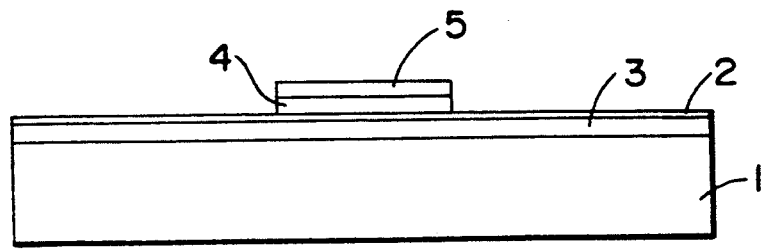
FIG. 3A to 3G are sectional views useful to explain a process for manufacturing the bipolar transistor according to the present invention.

FIG. 3A illustrates shielding of the active region with a silicon nitride layer 4 and a polysilicon layer 5, the active region constituting the emitter forming region. That is, first an N type epitaxial layer 1 is grown on the surface of P− type silicon wafer by arsenic ion injection and the thermal diffusion process, and a pad oxide film 2 is formed to a thickness of 300–800 Å on N type epitaxial layer 1 by oxidation under the dried oxygen atmosphere, and then boron is injected at a dose of $1-5 \times 10^{13}$ in the N type epitaxial layer 1 through the pad oxide film to form a P type epitaxial layer 3 of predetermined thickness. The P type layer 3 in the active region serves as an intrinsic base zone. Successively, the silicon nitride layer of 1500–2000 Å thickness and the polysilicon layer of 2000 Å are deposited on the whole surface of the substrate in turn and are etched by photolithography to form a stacked pattern of the silicon nitride layer 4 and the polysilicon layer 5, which contributes to shield and protect the afore-mentioned active region.

Figure 3B:
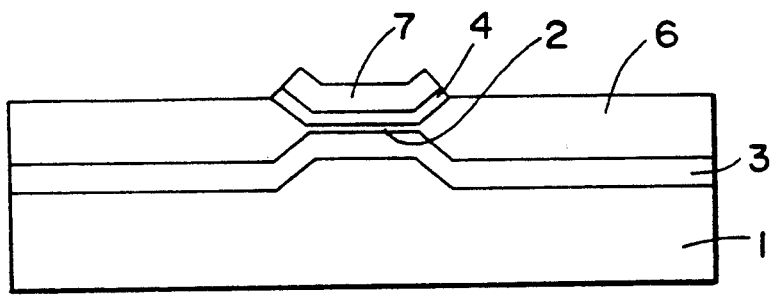

FIG. 3B illustrates the step of the field oxidation based upon the LOCOS process. In this step, field oxidation is carried onto the field region except the shielded active region of the sample given from the step of FIG. 3A so as to grow the field oxidation layer 6 of 4000–5500 Å thickness. At this time, an edge portion of the field oxidation 6, which abuts on the peripherals of the silicon nitride layer 4, is deformed into the aspect of the bird's beak, and the deformed portion will act as a spacer for separating the emitter region and the base terminal. Further, the polysilicon layer 5 is changed into the silicon dioxide layer 7 which, in addition to the pad oxide film 2 and the silicon nitride layer 4, will act as a shield or protect layer for the active region during the following reactive ion etching process.

Figure 3C:
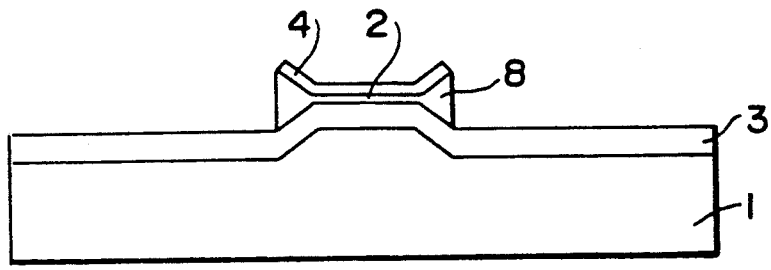

FIG. 3C illustrates a step for preparing a complete spacer 8. The field oxidation layer 6 formed through the LOCOS process shown in FIG. 3A is reduced to the spacer 8 of the bird's beak by means of reactive ion etching technology and only the silicon dioxide layer 7 is also removed. The width of the etched spacer 8 may be easily adjusted based upon the thickness of the field oxidation layer 6 and the resultant spacer 8 is adapted to have a minimum size, separating the emitter region and the base terminal.

Figure 3D:
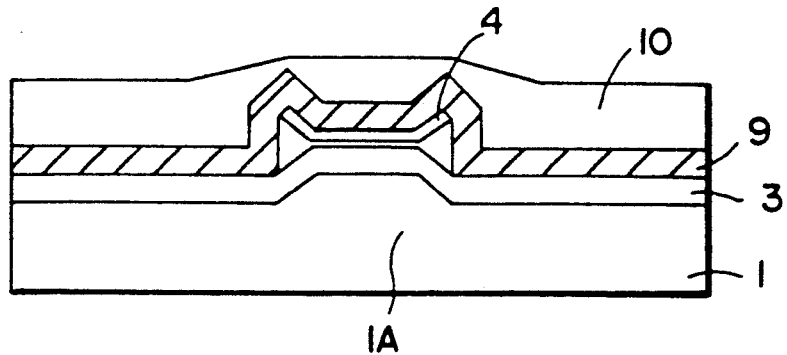

Referring to FIG. 3D, there is shown the step of depositing a second polysilicon layer 9 corresponding to a base terminal, wherein the second polysilicon layer 9 of 3000–5000 Å is first deposited on the sample given from the step of FIG. 3C, and a boron ion is injected into the polysilicon layer 9 to make the nonactive region of the P type epitaxial layer 3 change to the P+ extrinsic base region having impurities of high concentration, resulting in the reduction of the serial resistance of the base region. Thereafter, a photoresist 10 is coated on the polysilicon layer 9 and the polysilicon region 9 deposited on the active layer is etched back into that of FIG. 3E. Here, back etching is carried out by etching the photoresist with a first etchant to expose the second polysilicon layer positioned on the active region and etching said exposed second polysilicon layer with a second etchant and then etching the remaining photoresist with said first etchant. The second polysilicon layer left by the back etching process is provided with a spur extended upward near the spacer so that said second polysilicon layer so formed serves as a base terminal.

Figure 3E:
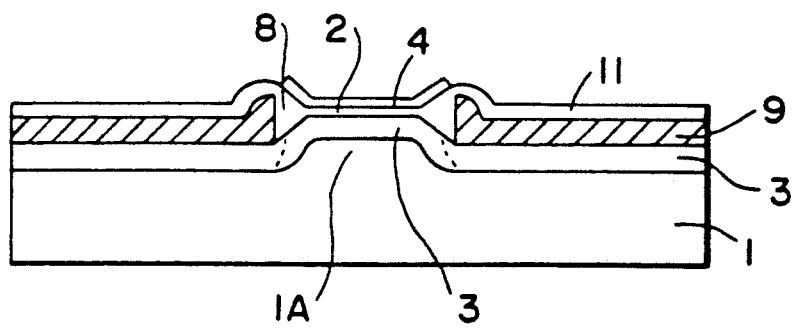

Successively, as shown in FIG. 3E, an oxide layer 11 is thermally grown only on the remaining polysilicon layer 9 of the nonactive region. The extrinsic base zone is simultaneously formed by the diffusion of the boron which has been implanted into the second polysilicon layer 9.

Figure 3F:
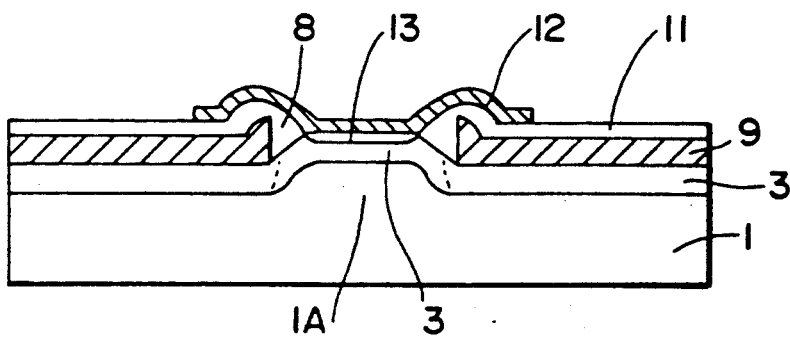

FIG. 3F illustrates a step of providing a patterned polysilicon layer 12 and a high concentration N type emitter region 13, in which after removing the pad oxide film 2 and the silicon nitride layer 4 from the sample of FIG. 3F, a third polysilicon layer of 2000-3000 Å thickness is deposited, and arsenic ions are injected into the third polysilicon layer at a dose of $5-9 \times 10^{15}$ to form an N type emitter region 13, and in turn by the photolithography over the polysilicon layer is obtained a patternized layer 12. The N type emitter region 13 is formed by the diffusion of the arsenic which has been implanted into the third polysilicon layer.

Figure 3G:
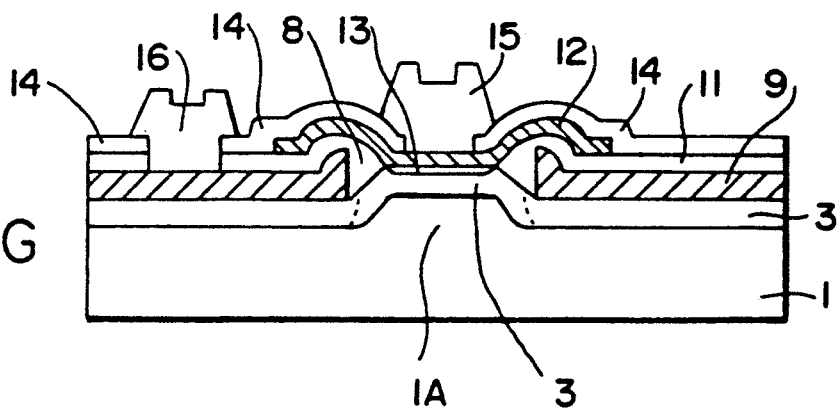

FIG. 3G represents a step of forming the emitter electrode 15 and the base electrode 16 by metallization process. Here, on the sample of FIG. 3F a silicon dioxide layer 14 of 3000-4000 Å thickness is deposited by means of chemical vapor deposition and then an emitter contact window and a base contact window are respectively formed at the corresponding emitter forming region and base forming region by photolithography, and finally selective metallizing onto the respective windows is carried to 8000-12000 Å thickness to form the emitter electrode 15 and the base electrode 16, resulting in the desired NPN type bipolar transistor according to the present invention.

Although the foregoing descriptions is limited to the manufacture of NPN type bipolar transistors according to the present invention, the technical idea covered by the appended claims is, of course, applicable to the manufacture of PNP type bipolar transistors.

What we claim is:

1. A method for manufacturing a high speed bipolar transistor having vertically an emitter zone, a base zone and a collector zone, comprising the following steps in sequence:
    (a) shielding an active region of said transistor with a silicon nitride layer and a first polysilicon layer stacked successively over the surface of an n-doped silicon substrate coated with a pad oxide film having a top portion formed with P+-ions through said pad oxide film;
    (b) locally growing said pad oxide film except said active region, to form a field oxide layer, said field oxide layer having a bird's beak extended into said active region, and to change said first polysilicon layer into a silicon oxide layer;
    (c) vertically etching said field oxide layer and said silicon oxide layer to leave only said bird's beak as a spacer, wherein a silicon nitride layer located on the active region serves as an etching mask;
    (d) depositing a P+-doped second polysilicon layer, coating a photoresist on said P+-doped second polysilicon layer, and then back etching to remove said P+-doped second polysilicon layer positioned on said silicon nitride layer and the photoresist positioned on said P+-doped polysilicon layer;
    (e) growing a silicon oxide layer on said P+-doped second polysilicon layer as a base terminal wherein a P+-doped layer serving as an extrinsic base is formed in said silicon substrate positioned below said P+-doped second polysilicon layer and is extended below said spacer;
    (f) removing said silicon nitride layer and pad oxide film positioned on said active region and forming an emitter terminal as a n+-doped third polysilicon layer; and
    (g) depositing an insulating layer and then forming said contacts and metallization.

2. The method according to claim 1 wherein said back etching step is performed by etching the photoresist with a first etchant to expose the second polysilicon layer positioned on the active region and etching said exposed second polysilicon layer with a second etchant, and then etching the remaining photoresist with said first etchant.

3. The method according to claim 1 wherein the thickness of the first polysilicon layer is about 2000 Angstrom units.

4. The method according to claim 3 wherein:
    said back etching step is performed by etching the photoresist with a first etchant to expose the second polysilicon layer positioned on the active region and etching said exposed second polysilicon layer with a second etchant, and
    then etching the remaining photoresist with said first etchant.

5. The method according to claim 4 wherein the thickness of said field oxide layer is approximately 4000 Angstrom units to 5000 Angstrom units.

6. The method according to claim 1 wherein the thickness of said field oxide layer is approximately 4000 Angstrom units to 5000 Angstrom units.

7. A method for manufacturing a high speed bipolar transistor having vertically an emitter zone, a base zone and a collector zone, comprising the following steps in sequence:
    (a) shielding an active region of said transistor with a silicon nitride layer and a first polysilicon layer stacked successively over a surface of an n-doped silicon substrate is coated with a pad oxide film having a top portion of which is formed with P+-ions through said pad oxide film;
    (b) locally growing said pad oxide film except said active region, to form a field oxide layer, said field oxide layer having a bird's beak extended into said active region, and to change said first polysilicon layer into a silicon oxide layer;
    (c) vertically etching said field oxide layer and said silicon oxide layer to leave only said bird's beak as a spacer, wherein a silicon nitride layer located on the active region serves as an etching mask;
    (d) depositing a P+-doped second polysilicon layer, coating a photoresist on said P+-doped second polysilicon layer, and then back etching to remove said P+-doped second polysilicon layer positioned on said silicon nitride layer and the photoresist positioned on said P+-doped polysilicon layer;

(e) growing a silicon oxide layer on said P+-doped second polysilicon layer as a base terminal wherein a P+-doped layer serving as an extrinsic base is formed in said silicon substrate positioned below said P+-doped second polysilicon layer and is extended below said spacer; and (f) removing said silicon nitride layer and pad oxide film positioned on said active region and forming an emitter terminal as a n+-doped third polysilicon layer.

8. The method according to claim 7 wherein:

said back etching step is performed by etching the photoresist with a first etchant to expose the second polysilicon layer positioned on the active region and etching said exposed second polysilicon layer with a second etchant, and then etching the remaining photoresist with said first etchant.

9. The method according to claim 7 wherein the thickness of the first polysilicon layer is about 2000 Angstrom units.

10. The method according to claim 7 wherein the thickness of said field oxide layer is approximately 4000 Angstrom units to 5000 Angstrom units.

11. A method for manufacturing a bipolar transistor, comprising:

(a) shielding an active region of semiconductor substrate with a pad oxide film, a silicon nitride layer and a first polysilicon layer stacked successively over the surface of a doped silicon substrate exhibiting a first-type conductivity, said doped silicon substrate having a top portion formed with ions exhibiting a second-type conductivity;

(b) locally oxidizing said pad oxide film except said active region to form a field oxide layer, said field oxide layer having a bird's beak extended into said active region, and to change said first polysilicon layer into a silicon oxide layer;

(c) vertically etching said field oxide layer and said silicon oxide layer to leave only said bird's beak as a spacer, wherein said silicon nitride layer located on the active region serves as an etching mask;

(d) depositing a second polysilicon layer doped with ions exhibiting said second-type conductivity, coating a photoresist thereon and then back etching said doped second polysilicon layer to remove said doped second polysilicon layer positioned on said silicon nitride layer and the photoresist positioned on said doped polysilicon layer;

(e) growing a silicon oxide layer on said doped second polysilicon layer as a base terminal wherein a doped layer exhibiting said second-type conductivity serving as an extrinsic base is formed in said silicon substrate positioned below said doped second polysilicon layer and is extended below said spacer;

(f) removing said silicon nitride layer and pad oxide film positioned on said active region and forming an emitter terminal as a doped third polysilicon layer exhibiting said first-type conductivity; and (g) depositing an insulating layer and then forming said contacts and metallization.

12. The method according to claim 11 wherein said back etching step is performed by etching the photoresist with a first etchant to expose the second polysilicon layer positioned on the active region and etching said exposed second polysilicon layer with a second etchant, and then etching the remaining photoresist with said first etchant.

13. The method according to claim 11 wherein the first polysilicon layer is about 2000 Å in thickness.

14. The method according to claim 11, wherein said field oxide layer is approximately 4000 Å to 5000 Å in thickness.

* * * * *